(12) United States Patent
Okuaki et al.

(10) Patent No.: US 10,429,137 B2
(45) Date of Patent: Oct. 1, 2019

(54) HEAT SINK

(71) Applicant: Fanuc Corporation, Yamanashi (JP)

(72) Inventors: Kenichi Okuaki, Yamanashi (JP); Kazuhiro Yamamoto, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 15/817,462

(22) Filed: Nov. 20, 2017

(65) Prior Publication Data

US 2018/0164049 A1   Jun. 14, 2018

(30) Foreign Application Priority Data

Dec. 14, 2016   (JP) ................................. 2016-242643

(51) Int. Cl.
    F28F 3/12       (2006.01)
    F28F 3/06       (2006.01)
    F28F 3/04       (2006.01)
    H05K 7/20       (2006.01)
    F28D 21/00      (2006.01)

(52) U.S. Cl.
    CPC ............... *F28F 3/06* (2013.01); *F28F 3/048* (2013.01); *F28F 3/12* (2013.01); *H05K 7/20918* (2013.01); *F28D 2021/0029* (2013.01); *F28F 2275/10* (2013.01); *F28F 2275/14* (2013.01)

(58) Field of Classification Search
    CPC ................ H01L 21/4882; F28F 2275/14
    USPC ......................................... 165/76, 80.3, 185
    See application file for complete search history.

(56) References Cited

U.S. PATENT DOCUMENTS

| | | | | |
|---|---|---|---|---|
| 5,784,776 | A * | 7/1998 | Saito et al. | B21B 1/227 29/727 |
| 5,937,517 | A * | 8/1999 | Smith et al. | B23P 15/26 257/E23.102 |
| 6,101,715 | A * | 8/2000 | Fuesser et al. | H01C 1/082 165/104.33 |
| 6,396,693 | B1 * | 5/2002 | Shih | H01L 23/3672 257/E23.099 |
| 6,446,715 | B2 * | 9/2002 | Watanabe et al. | F28D 1/0316 165/177 |

(Continued)

FOREIGN PATENT DOCUMENTS

| | | |
|---|---|---|
| CN | 101309577 A | 11/2008 |
| CN | 201252711 Y | 6/2009 |

(Continued)

OTHER PUBLICATIONS

Japan Patent Office, Decision to Grant a Patent dated Jul. 3, 2018 for Japan Patent Application No. 2016-242643.

(Continued)

*Primary Examiner* — Allen J Flanigan
(74) *Attorney, Agent, or Firm* — Winstead PC

(57) ABSTRACT

A heat sink includes: a heat sink body made of a metal material which includes a plurality of heat radiating fins having a flat plate shape, the heat radiating fins being arranged parallel to each other on one surface side of a base having a flat plate shape at intervals in a direction along a surface of the base; and a bridge member made of a metal material which has a plurality of grooves parallel to each other, the grooves being formed at a pitch equal to an arrangement pitch of the heat radiating fins of the heat sink body, and the grooves accommodating distal ends of the respective heat radiating fins in a press-fitted state.

4 Claims, 5 Drawing Sheets

(56) References Cited

U.S. PATENT DOCUMENTS

| | | | |
|---|---|---|---|
| 6,493,227 B2 * | 12/2002 | Nielsen et al. | H05K 7/20918 165/185 |
| 7,749,609 B2 * | 7/2010 | Kaimura et al. | B21C 37/14 165/177 |
| 2005/0103472 A1 | 5/2005 | Lofland et al. | |
| 2005/0121172 A1 | 6/2005 | Lopatinsky | |
| 2005/0199372 A1 * | 9/2005 | Frazer et al. | F28F 3/12 165/80.4 |
| 2008/0283234 A1 | 11/2008 | Sagi et al. | |

FOREIGN PATENT DOCUMENTS

| | | |
|---|---|---|
| CN | 103779285 A | 5/2014 |
| CN | 207489855 U | 6/2018 |
| DE | 102006055455 A1 | 5/2008 |
| GB | 2493019 A | 1/2013 |
| JP | H06-021251 Y | 6/1994 |
| JP | H07-326879 A | 12/1995 |
| JP | H11-74429 A | 3/1999 |
| JP | 2001-110958 A | 4/2001 |
| JP | 2001-127221 A | 5/2001 |
| JP | 2005-150755 A | 6/2005 |
| JP | 2013-024483 A | 2/2013 |

OTHER PUBLICATIONS

German Patent and Trademark Office, Office Action dated Sep. 6, 2018 for German Patent Application No. 102017129357.4.

* cited by examiner

HEAT SINK

CROSS-REFERENCE TO RELATED APPLICATIONS

This application is based on Japanese Patent Application No. 2016-242643, the contents of which are incorporated herein by reference.

TECHNICAL FIELD

The present invention relates to a heat sink.

BACKGROUND ART

Conventionally, in a motor drive device where a power device is required to be cooled, there is used a heat sink having a structure where a base having a flat plate shape is joined to the power device, a plurality of heat radiating fins having a flat plate shape are arranged parallel to each other at intervals on the base such that the heat radiating fins extend orthogonally to the base from a surface of the base on a side opposite to a surface of the base joined to the power device, and distal ends of the plurality of heat radiating fins are connected with each other by way of a bridge member formed by bending a metal plate in a zigzag shape (see Japanese Unexamined Patent Application, Publication No. 2001-110958 (PTL 1), for example).

CITATION LIST

Patent Literature

{PTL 1}
Japanese Unexamined Patent Application, Publication No. 2001-110958

SUMMARY OF INVENTION

According to one aspect of the present invention, there is provided a heat sink which includes: a heat sink body made of a metal material which includes a plurality of heat radiating fins having a flat plate shape, the heat radiating fins being arranged parallel to each other on one surface side of a base having a flat plate shape at intervals in a direction along a surface of the base; and a bridge member made of a metal material which has a plurality of grooves parallel to each other, the grooves being formed at a pitch equal to an arrangement pitch of the heat radiating fins of the heat sink body, and the grooves accommodating distal ends of the respective heat radiating fins in a press-fitted state.

According to another aspect of the present invention, there is provided a heat sink which includes: a heat sink body made of a metal material which includes a plurality of heat radiating fins having a flat plate shape, the heat radiating fins being arranged parallel to each other on one surface side of a base having a flat plate shape at intervals in a direction along a surface of the base; and a bridge member having a flat plate shape and made of a metal material, wherein the bridge member includes a plurality of protrusions on one surface side of the bridge member, the protrusions being arranged parallel to each other at intervals in a direction along a surface of the bridge member, and the heat radiating fins have grooves at distal ends of the heat radiating fins, the grooves being formed at a pitch equal to an arrangement pitch of the protrusions of the bridge member, and the grooves accommodating distal ends of the respective protrusions in a press-fitted state.

DESCRIPTION OF EMBODIMENTS

A heat sink 1 according to one embodiment of the present invention is described hereinafter with reference to drawings.

Figure 1:
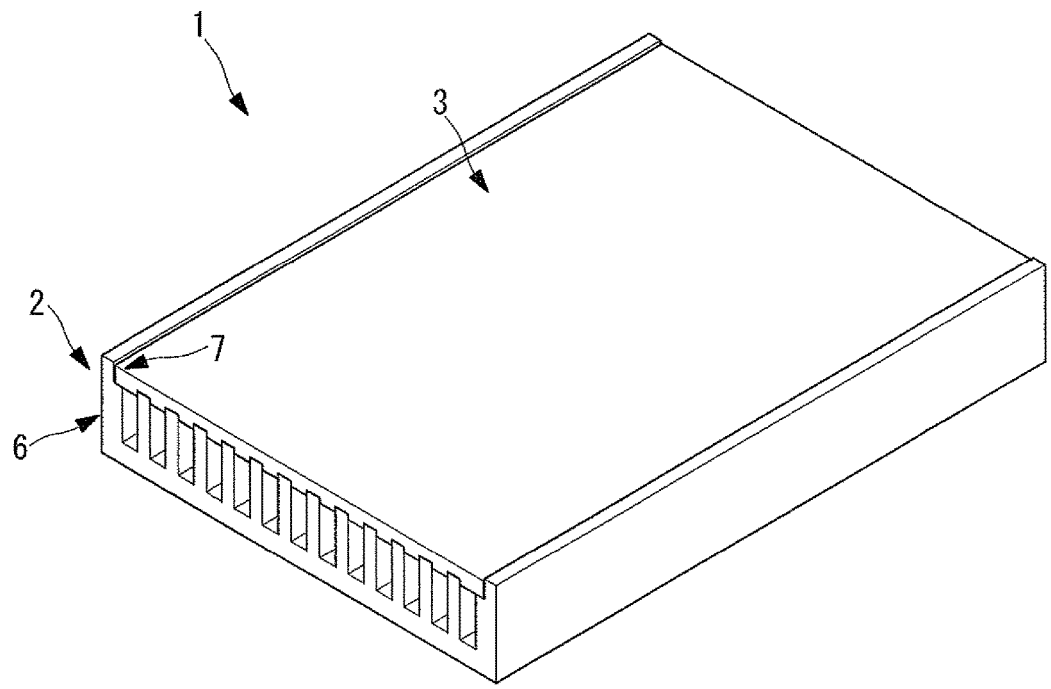
FIG. 1 is a perspective view showing a heat sink according to one embodiment of the present invention.
Figure 2:
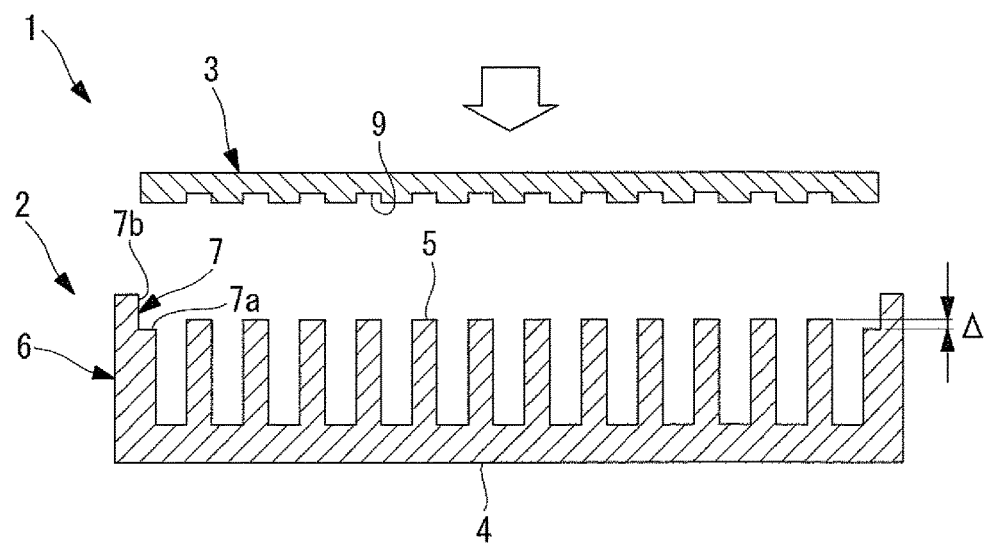
FIG. 2 is an exploded view of the heat sink shown in FIG. 1.

As shown in FIGS. 1 and 2, the heat sink 1 according to this embodiment includes a heat sink body 2 and a bridge member 3.

The heat sink body 2 and the bridge member 3 are made of a metal material having high heat conductivity such as aluminum, an aluminum alloy or copper.

The heat sink body 2 includes: a base 4 having a rectangular plate shape; a plurality of heat radiating fins 5 having a flat plate shape which are arranged parallel to each other at intervals at a fixed pitch in the direction along a surface of the base 4; and side plates 6 disposed at both ends of the heat sink body 2 in the arrangement direction of the heat radiating fins 5 and extending parallel to the heat radiating fins 5.

The base 4 and the heat radiating fins 5 are formed as an integral body, and each heat radiating fin 5 extends in the direction orthogonal to the base 4.

All heat radiating fins 5 are formed to have the same height from the base 4, and two side plates 6 are formed to have a height larger than the height of the heat radiating fins 5.

Each of two side plates 6 has a stepped portion 7 on the inner side, that is, on the heat radiating fin 5 side, of a distal end thereof.

The stepped portion 7 has: a first surface 7a extending parallel to the base 4; and a second surface 7b which is orthogonal to the first surface 7a and extends parallel to the heat radiating fins 5.

The first surface 7a is disposed at a position lower than a distal end of the heat radiating fin 5 by a distance A.

Figure 3:
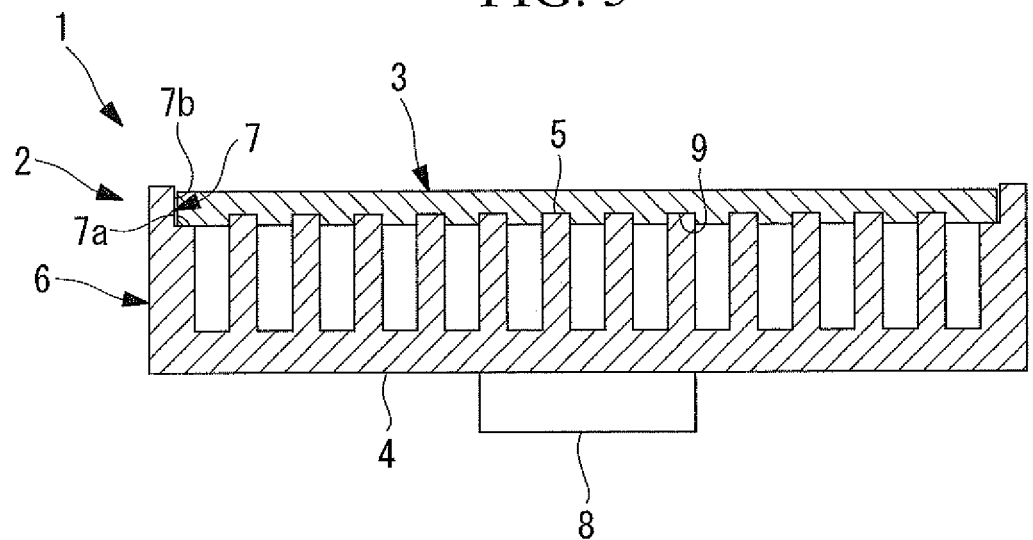
FIG. 3 is an assembly view showing the heat sink in FIG. 1.

As shown in FIG. 3, an electronic component 8 which is an object to be cooled is mounted on a surface of the base 4 of the heat sink body 2 on a side opposite to the heat radiating fins 5.

The bridge member 3 is formed into a rectangular plate shape, and a plurality of grooves 9, each of which has a width size substantially equal to a thickness of the heat radiating fin 5, are formed on a surface of the bridge member 3 on one side at a pitch substantially equal to the arrangement pitch of the heat radiating fins 5. With such a configuration, the distal ends of the heat radiating fins 5 can be press-fitted in the grooves 9 respectively.

A depth of the grooves 9 is set equal to or more than the distance A between a distal end surface of the heat radiating fin 5 and the first surface 7*a*.

A width size of the bridge member 3 is set slightly smaller than a distance between two second surfaces 7*b* formed on two side plates 6 respectively.

A thickness size of the bridge member 3 is set smaller than a height size of the second surface 7*b* of the stepped portion 7.

Advantageous effects of the heat sink 1 according to this embodiment having such a configuration are described hereinafter.

In assembling the heat sink 1 according to this embodiment, as shown in FIGS. 1 and 2, the heat sink body 2 and the bridge member 3 are disposed such that the distal ends of the heat radiating fins 5 and the grooves 9 opposedly face each other. In such a state, the heat sink body 2 and the bridge member 3 are pressed in the direction both members approach to each other. With such an operation, the bridge member 3 is disposed between the second surfaces 7*b* of the side plates 6 of the heat sink body 2, and the distal ends of the heat radiating fins 5 are press-fitted in the grooves 9.

When the distal ends of the heat radiating fins 5 are sufficiently press-fitted in the grooves 9 in the depth direction, the surface of the bridge member 3 on the groove 9 side impinges on the first surfaces 7*a* of the side plates 6 so that further pressing is stopped. With such operations, due to friction between side surfaces of the heat radiating fins 5 which are press-fitted in the grooves 9 and the inner surfaces of the grooves 9, the bridge member 3 is fixed to the heat sink body 2 such that the bridge member 3 is not removed from the heat sink body 2. Accordingly, the hollow heat sink 1 having a plurality of through holes is formed where the distal ends of the plurality of heat radiating fins 5 are connected with each other by way of the bridge member 3.

Figure 4:
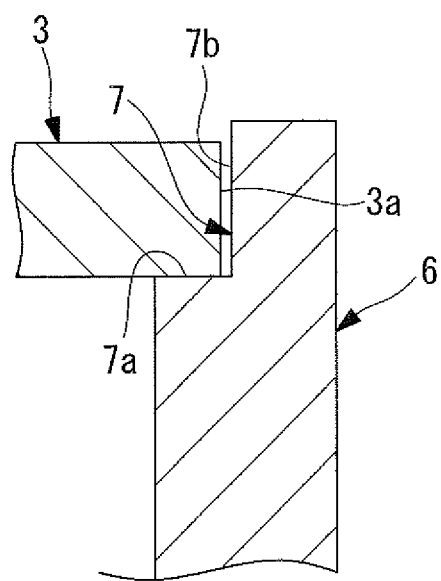
FIG. 4 is a partially enlarged view showing a joint portion between a bridge member and a stepped portion of a heat sink body of the heat sink shown in FIG. 1.

In this case, the depth of the grooves 9 is set equal to or more than the distance A between the distal end surface of the heat radiating fin 5 and the first surface 7*a*, and the thickness size of the bridge member 3 is set smaller than the height size of the second surface 7*b* of the stepped portion 7. Accordingly, as shown in FIGS. 3 and 4, when the distal ends of the heat radiating fins 5 are press-fitted in the grooves 9 to a position where the surface of the bridge member 3 on the groove 9 side is brought into contact with the first surfaces 7*a*, the bridge member 3 is completely accommodated in the stepped portions 7 thus being disposed at a position retracted from the distal ends of the side plates 6.

Further, the distance between two second surfaces 7*b* of two side plates 6 is set larger than the width size of the bridge member 3. Accordingly, in a state where the bridge member 3 is mounted on the heat sink body 2, a gap is formed between each end surface 3*a* of the bridge member 3 and each second surface 7*b* which opposedly face each other.

As described above, according to the heat sink 1 of this embodiment, the heat radiating fins 5 are press-fitted in the grooves 9 so that the side surfaces of the heat radiating fins 5 and the inner surfaces of the groove 9 are brought into close contact with each other. Accordingly, heat from the electronic component 8 which is conducted through the heat radiating fins 5 is favorably conducted to the bridge member 3 and hence, heat radiation performance can be enhanced. A required operation is merely to press-fitting the heat radiating fins 5 in the grooves 9, and a joining operation such as soldering is unnecessary and hence, it is possible to acquire an advantageous effect that a facility such as a furnace, which is expensive and requires a running cost, is unnecessary.

The distal ends of all heat radiating fins 5 are press-fitted in the grooves 9. Accordingly, even under an installation condition where the bridge member 3 is disposed on a lower side of the heat sink 1 in the vertical direction, it is possible to prevent the separation of the bridge member 3 from the heat sink body 2 due to gravity so that lowering of cooling performance can be surely prevented.

In the assembled heat sink 1, the bridge member 3 is disposed at a position retracted from the distal ends of the side plates 6 and hence, irrespective of the assembly state, the heat sink 1 having a size smaller than a size of the heat sink body 2 can be formed. As a result, by merely forming the heat sink body 2 with high accuracy, a profile size of the heat sink 1 can be easily controlled.

Gaps are formed between the end surfaces 3*a* of the bridge member 3 and the second surfaces 7*b*. Accordingly, it is possible to acquire an advantageous effect that even when there are irregularities in size of the bridge member 3 in the width direction, the heat sink 1 can be easily assembled.

Further, the first surface 7*a* of each side plate 6 can function as a stopper on which the surface of the bridge member 3 is impinged. Accordingly, even when the heat radiating fins 5 are formed with a small thickness, it is possible to prevent the heat radiating fins 5 from being damaged due to excessive pressure.

Figure 5:
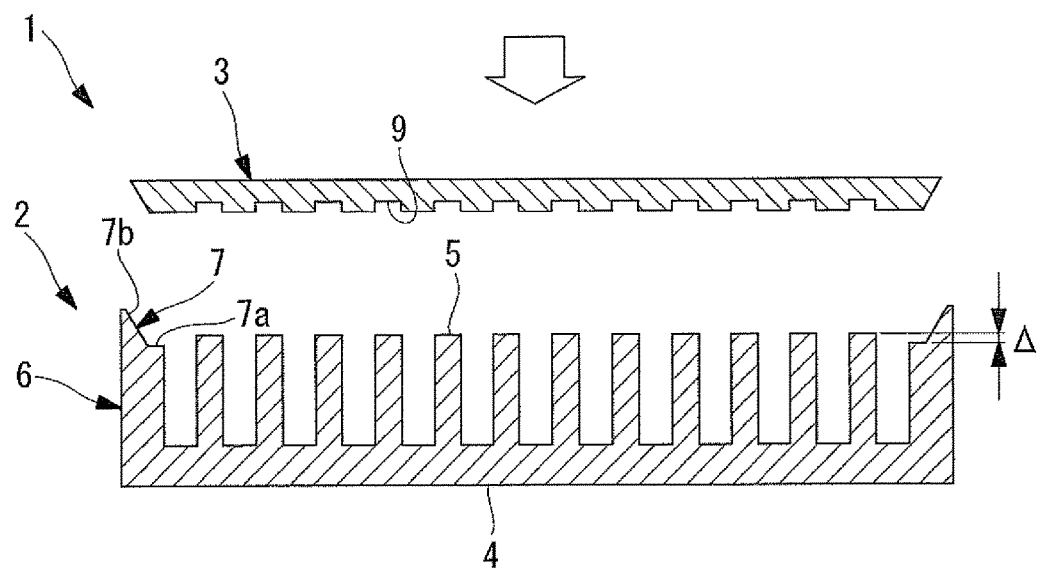
FIG. 5 is an exploded view showing a first modification of the heat sink shown in FIG. 1.
Figure 6:
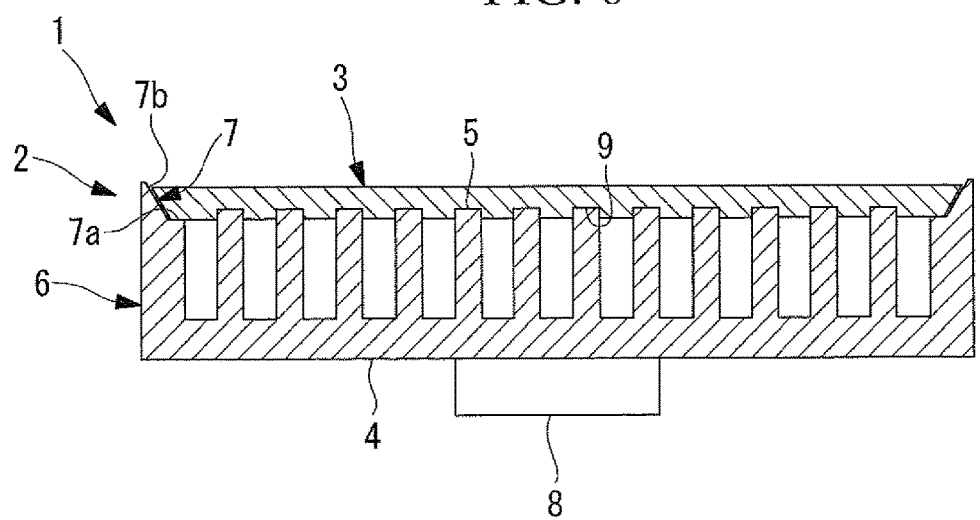
FIG. 6 is an assembly view showing the heat sink shown in FIG. 5.
Figure 7:
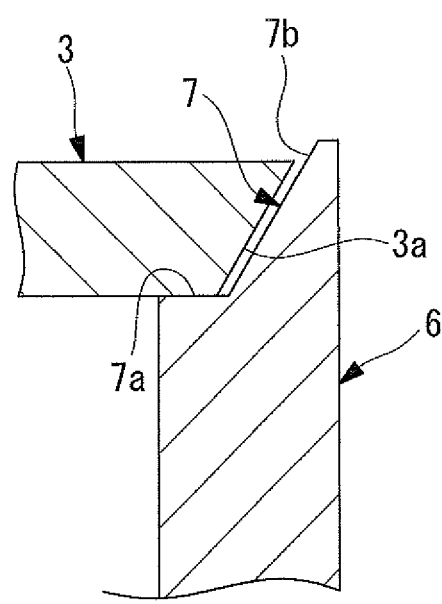
FIG. 7 is a partially enlarged view showing a joint portion between a bridge member and a stepped portion of the heat sink body of the heat sink shown in FIG. 5.

In this embodiment, the first surface 7*a* and the second surface 7*b* of the stepped portion 7 formed on each side plate 6 of the heat sink 1 are orthogonal to each other. However, instead of such a configuration, as shown in FIGS. 5 to 7, a second surface 7*b* may be configured such that the second surface 7*b* is an inclined surface where a distance between two second surfaces 7*b* gradually increases from the first surface 7*a* to the distal end. In this case, a bridge member 3 is adopted where end edges of the bridge member 3 respectively have an inclined surface complementary to the second surface 7*b*.

With such a configuration, it is possible to acquire an advantageous effect that insertability of the bridge member 3 to the heat sink body 2 during assembly can be improved.

In this embodiment, the number, intervals, the thickness size, the height size, the pitch and the like of the heat radiating fins 5 are not limited, and desirable size and the like can be adopted. Further, an arbitrary material may be adopted as a material for forming the heat sink body 2 and the bridge member 3 provided that the material is a metal material having high heat conductivity. Alternatively, different materials may be adopted as materials for forming the heat sink body 2 and the bridge member 3.

Figure 8:
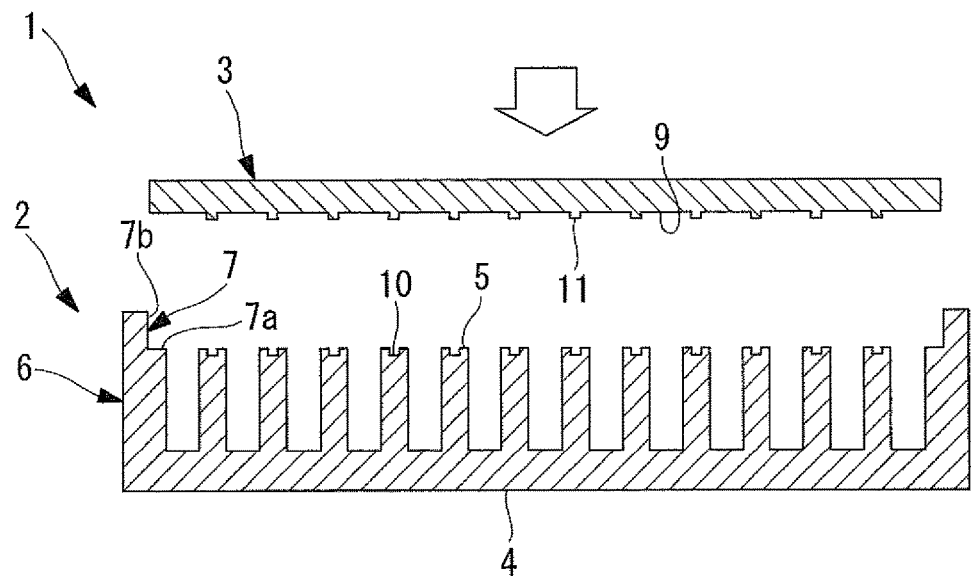
FIG. 8 is an exploded view showing a second modification of a heat sink shown in FIG. 1.
Figure 9:
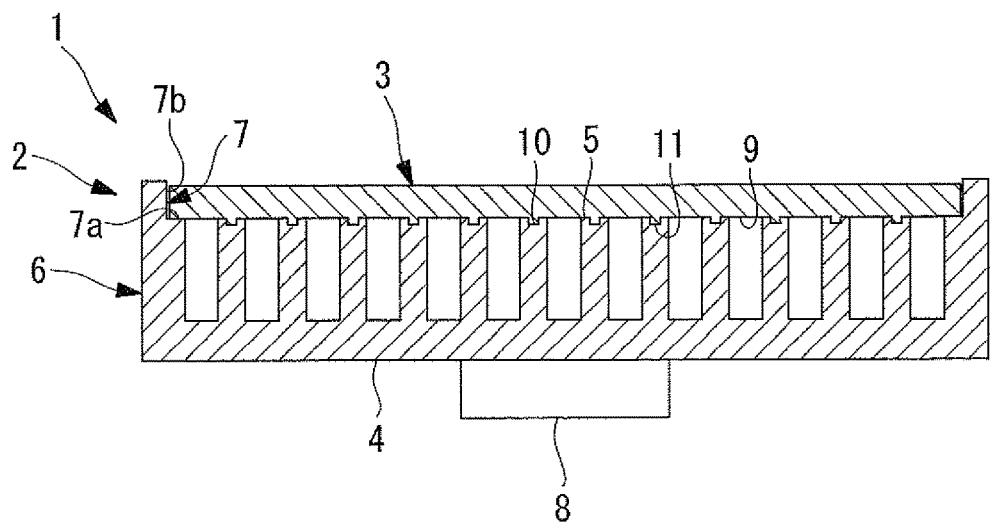
FIG. 9 is an assembly view showing the heat sink shown in FIG. 8.

In this embodiment, the configuration is adopted where the distal ends of the heat radiating fins 5 are press-fitted in the grooves 9 so as to fix the bridge member 3 to the heat sink body 2. However, instead of such a configuration, as shown in FIGS. 8 and 9, a configuration may be adopted where a groove 10 is formed on a distal end of each heat radiating fin 5, and protrusions 11 formed on one surface of the bridge member 3 are press-fitted in the grooves 10 in the depth direction.

In this case, the protrusions 11 are formed on a surface of the bridge member 3 on one side at the pitch equal to the arrangement pitch of the grooves 10, and each protrusion 11 has substantially the same width size as the groove 10.

From the above-described embodiments and modifications thereof, the following aspects of the invention are derived.

According to one aspect of the present invention, there is provided a heat sink which includes: a heat sink body made of a metal material which includes a plurality of heat radiating fins having a flat plate shape, the heat radiating fins being arranged parallel to each other on one surface side of a base having a flat plate shape at intervals in a direction along a surface of the base; and a bridge member made of a metal material which has a plurality of grooves parallel to each other, the grooves being formed at a pitch equal to an arrangement pitch of the heat radiating fins of the heat sink body, and the grooves accommodating distal ends of the respective heat radiating fins in a press-fitted state.

According to this aspect, in a state where the distal ends of the plurality of heat radiating fins of the heat sink body are respectively allocated to the plurality of grooves of the bridge member, the heat sink body and the bridge member are pressed in the direction both members approach to each other. Accordingly, the distal ends of the heat radiating fins are press-fitted in the grooves of the bridge member so that both members are integrally joined with each other. The heat sink body and the bridge member are made of a metal material, and inner surfaces of the grooves and surfaces of the fins are brought into close contact with each other by press-fitting. As a result, sufficient heat conductivity from the heat radiating fins to the bridge member can be ensured so that heat radiation performance can be enhanced.

In the above-mentioned aspect, it may be configured such that the heat sink body includes a side plate extending parallel to the heat radiating fins from the base at both ends of the heat sink body in an arrangement direction of the heat radiating fins, and the heat sink has a stepped portion on an inner side of a distal end of the side plate, the stepped portion accommodating an end edge of the bridge member so as to allow the bridge member to be disposed at a position retracted from a distal end of the side plate in a state where the bridge member is mounted on the heat sink body by making the distal ends of the heat radiating fins press-fitted in the grooves.

With such a configuration, when the heat sink body and the bridge member are joined with each other by pressing, the end edges of the bridge member are accommodated in the stepped portions formed on the inner sides of the distal ends of the side plates provided to the heat sink body whereby the bridge member is disposed at a position retracted from the distal ends of the side plates. Accordingly, there is no possibility that the assembled heat sink becomes larger than a profile size of the heat sink body so that a profile size of the heat sink can be easily controlled.

In the above-mentioned aspect, it may be configured such that the stepped portion has: a first surface which opposedly faces a surface of the bridge member on a groove side; and a second surface which is orthogonal to the first surface, and opposedly faces an end surface of the bridge member with a gap between the second surface and the end surface of the bridge member.

With such a configuration, when the heat sink body and the bridge member are joined with each other by pressing so that the end edges of the bridge member are accommodated in the stepped portions of the side plates, the surface of the bridge member on the groove side impinges on the first surfaces of the stepped portions, and each end surface of the bridge member is disposed with a gap between the end surface and the second surface of the stepped portion. Accordingly, even when there is a dimensional error in the heat radiating fins in the arrangement direction of the heat radiating fins, the dimensional error can be absorbed by the gaps so that the heat sink can be assembled in a simple manner.

In the above-mentioned aspect, it may be configured such that the end surface of the bridge member is an inclined surface which is tapered toward the surface of the bridge member on the groove side.

With such a configuration, each stepped portion formed on the side plate of the heat sink body is formed such that the second surface spreads toward the distal end of the side plate. Accordingly, the stepped portions can easily accommodate the bridge member having inclined surfaces each of which is tapered toward the surface of the bridge member on the groove side.

According to another aspect of the present invention, there is provided a heat sink which includes: a heat sink body made of a metal material which includes a plurality of heat radiating fins having a flat plate shape, the heat radiating fins being arranged parallel to each other on one surface side of a base having a flat plate shape at intervals in a direction along a surface of the base; and a bridge member having a flat plate shape and made of a metal material, wherein the bridge member includes a plurality of protrusions on one surface side of the bridge member, the protrusions being arranged parallel to each other at intervals in a direction along a surface of the bridge member, and the heat radiating fins have grooves at distal ends of the heat radiating fins, the grooves being formed at a pitch equal to an arrangement pitch of the protrusions of the bridge member, and the grooves accommodating distal ends of the respective protrusions in a press-fitted state.

According to this aspect, in a state where the plurality of protrusions of the bridge member are respectively allocated to the grooves formed on the distal ends of the plurality of heat radiating fins of the heat sink body, the heat sink body and the bridge member are pressed in the direction that both members approach to each other. Accordingly, the protrusions of the bridge member are press-fitted in the grooves formed on the distal ends of the heat radiating fins so that both members are integrally joined with each other. The heat sink body and the bridge member are made of a metal material, and the inner surfaces of the grooves and the surfaces of the fins are brought into close contact with each other by press-fitting. As a result, sufficient heat conductivity from the heat radiating fins to the bridge member can be ensured so that heat radiation performance can be enhanced.

REFERENCE SIGNS LIST

1 heat sink
2 heat sink body
3 bridge member
3a end surface
4 base
5 heat radiating fin
6 side plate
7 stepped portion
7a first surface
7b second surface
9 groove

The invention claimed is:

1. A heat sink comprising:
   a heat sink body made of a metal material which includes a plurality of heat radiating fins having a flat plate shape, the plurality of heat radiating fins being arranged parallel to each other on one surface side of a base having a flat plate shape at intervals in a direction along a surface of the base;
   a bridge member made of a metal material which has a plurality of grooves parallel to each other, the plurality of grooves being formed at a pitch equal to an arrangement pitch of the plurality of heat radiating fins of the heat sink body, and the plurality of grooves accommodating distal ends of the respective heat radiating fins in a press-fitted state;
   wherein the heat sink body includes a side plate extending parallel to the plurality of heat radiating fins from the base at both ends of the heat sink body in an arrangement direction of the plurality of heat radiating fins;
   wherein the heat sink has a stepped portion on an inner side of a distal end of the side plate, the stepped portion accommodating an end edge of the bridge member; and
   an upper surface of the bridge member is recessed from the surface of an upper end of the side plate in an extension direction of the side plate when the bridge member is mounted on the heat sink body by making the distal ends of the plurality of heat radiating fins press-fitted in the plurality of grooves.

2. The heat sink according to claim 1, wherein the stepped portion has:
   a first surface which opposedly faces a surface of the bridge member on a groove side; and
   a second surface which is orthogonal to the first surface, and opposedly faces an end surface of the bridge member with a gap between the second surface and the end surface of a bridge member.

3. The heat sink according to claim 1, wherein an end surface of the bridge member is an inclined surface which is tapered toward the surface of the bridge member on the groove side.

4. A heat sink comprising:
   a heat sink body made of a metal material which includes a plurality of heat radiating fins having a flat plate shape, the plurality of heat radiating fins being arranged parallel to each other on one surface side of a base having a flat plate shape at intervals in a direction along a surface of the base;
   a bridge member having a flat plate shape and made of a metal material, wherein the bridge member includes a plurality of protrusions on one surface side of the bridge member, the plurality of protrusions being arranged parallel to each other at intervals in a direction along a surface of the bridge member;
   the plurality of heat radiating fins have grooves at distal ends of the plurality of heat radiating fins, the grooves being formed at a pitch equal to an arrangement pitch of the plurality of protrusions of the bridge member, and the grooves accommodating distal ends of the respective protrusions in a press-fitted state, wherein:
   the heat sink body includes a side plate extending parallel to the plurality of heat radiating fins from the base at both ends of the heat sink body in an arrangement direction of the plurality of heat radiating fins;
   the heat sink comprises a stepped portion on an inner side of a distal end of the side plate, the stepped portion accommodating an end edge of the bridge member; and
   an upper surface of the bridge member is recessed from the surface of an upper end of the side plate in an extension direction of the side plate when the bridge member is mounted on the heat sink body.

* * * * *